United States Patent [19]

Summers

[11] 4,358,790
[45] Nov. 9, 1982

[54] ELECTRICAL DATA PULSE SLICING

[75] Inventor: Christopher P. Summers, London, England

[73] Assignee: U.S. Philips Corporation, New York, N.Y.

[21] Appl. No.: 141,517

[22] Filed: Apr. 18, 1980

[30] Foreign Application Priority Data

May 4, 1979 [GB] United Kingdom ............... 7915682

[51] Int. Cl.$^3$ ............................................. H04N 7/08
[52] U.S. Cl. ....................................... 358/147; 375/76
[58] Field of Search ................. 358/147, 141, 145, 13, 358/183; 375/76

[56] References Cited

U.S. PATENT DOCUMENTS 4,222,073 9/1980 Hirashima ........................ 358/147

Primary Examiner—Richard Murray

Attorney, Agent, or Firm—Thomas A. Briody; William J. Streeter; Edward W. Goodman

[57] ABSTRACT

A method of and an arrangement for slicing data in the form of a bi-amplitude data pulse signal comprising a sequence of clock pulses followed by a sequence of data pulses. The absolute mean amplitude of the sequence of clock pulses is used as the slicing level for the sequence of data pulses. As shown in FIGS. 3(a) to 3(d) and FIG. 5, the slicing level s is produced by an integrator 22,23 in response to a difference signal v−d'. The signal v is the incoming data pulse signal and the signal d' is a modified sliced data pulse signal which is produced by a multiplier 25. The multiplier 25 is fed by a sliced data pulse signal d and an amplitude correction factor a which is twice the difference between the black level amplitude and the mean of the amplitude of the sequence of clock pulses.

8 Claims, 9 Drawing Figures

ELECTRICAL DATA PULSE SLICING

BACKGROUND OF THE INVENTION

This invention relates to electrical data pulse slicing, and more particularly to a method of and an arrangement for electrical data pulse slicing.

The invention has a particular but non-exclusive application in television receiver apparatus in or for use in a television system of a character in which coded data pulses, pertaining to alpha-numeric text or other message information, are transmitted in a video signal in at least one television line in field-blanking intervals where no picture signals pertaining to normal picture information are present.

A television system of the above character is described in United Kingdom patent specification No. 1,370,535. A conventional television receiver for the system includes, or has associated with it, additional means comprising a data acquisition circuit to extract the coded data pulses from a received video signal. The extracted coded data pulses are stored in a storage device of the additional means and, after a plurality of frame periods, an entity of related message information, for example a page of text, has been received and stored. The additional means also includes a decoding circuit for converting the stored message information into a video signal which is used to cause the display of the message information at the television receiver.

In the implementation of a practical data acquisition circuit for extracting coded data pulses from a received video signal, a difficulty that arises is to determine in the data acquisition circuit, a suitable bias voltage level, relative to the received signal level, which serves as a so-called "slicing level". Only pulse amplitudes in the received video signal which are greater than the slicing level are extracted as data pulses.

It is known to provide in the data acquisition circuit a data slicing arrangement which clamps the received video signal and slices it at a fixed d.c. level. However, this data slicing technique imposes the limitation that the level of the received video signal has to remain fairly accurately related to the fixed d.c. level at all times, which can cause problems, in particular when video signals may be received from different transmission sources.

With a view to avoiding the above limitation, adaptive data slicing techniques have been proposed. In a first known adaptive data slicing arrangement the slicing level is set automatically mid-way between positive and negative peaks of the received video signal. In a second known adaptive data slicing arrangement, for use where a block of coded data pulses is preceded by a sequence of clock run-in pulses, the slicing level for the block of coded data pulses is set to be the mean amplitude of the pulses that form the clock run-in sequence.

These two known adaptive data slicing arrangements mentioned above have, in particular, been developed for a data acquisition circuit for receiving Teletext data as broadcast in the United Kingdom by the BBC and the IBA using their respective CEEFAX and ORACLE data transmission systems which operate within the broadcast standards for the 625-line domestic television system as employed in the United Kingdom.

In order to slice Teletext data correctly off a received video signal, variations in amplitude of the Teletext, data due to its reception from different transmission sources, is not the only problem which has to be overcome. Further problems may be caused by: a weak signal in the presence of random noise; amplitude and group delay distortions which produce "overshoots" in the pulse waveforms in the video signal; and co-channel interference which produces low frequency variations in the video signal.

In an embodiment of the first known adaptive data slicing arrangement referred to above, two peak detectors are used to store the positive and negative peaks, respectively, of received Teletext data. Two storage capacitors are used for this purpose and the slicing level is set at the mean (50%) of the two capacitor voltages. In order that this arrangement is not unacceptably affected by co-channel interference, it requires a short "attack" (charging) time constant, whereas it requires a relatively longer "attack" time constant in order not to be unacceptably affected by "overshoots". Therefore a compromise has to be made when selecting the "attack" time constant, but a shorter time constant may be preferred so that co-channel interference can be followed when determining the slicing level. A shorter time constant also improves the performance of the arrangement in the presence of noise.

In an embodiment of the second known adaptive data slicing arrangement referred to above, an integrating capacitor is used to store the mean magnitude of the pulses that form the clock run-in sequence, and the slicing level is held at this mean magnitude for the duration of the block of coded data pulses that follow the clock run-in sequence. With this second arrangement "overshoots" have no significant effect on the slicing level, but the arrangement cannot follow (and thus cope with) co-channel interference. This arrangement may perform better than the first arrangement in the presence of noise. However, it is more complex in implementation in that it requires a timing circuit to gate out the clock run-in sequence on each occurrence thereof.

SUMMARY OF THE INVENTION

It is an object of the present invention to provide an improved method of data slicing, and an arrangement for performing the method.

According to the invention there is provided a method of slicing data, in the form of a bi-amplitude data pulse signal comprising a sequence of clock pulses followed by a sequence of data pulses, which method is characterized in that it consists in: producing from a received data pulse signal a sliced data pulse signal using an adaptive data slicing level which tends to be held at a predetermined proportion of the absolute amplitude of the received data pulse signal by means of a level correcting signal which is derived from the amplitude difference between the received data pulse signal and a modified sliced data pulse signal, which latter is produced by multiplying the sliced data pulse signal by an amplitude correction factor which is a function of the difference between the mean amplitude of at least part of the sequence of clock pulses and one of the two subsisting amplitudes of the received data pulse signal.

A method of slicing data according to the invention affords the advantage that since the level correcting signal is derived from at least part of the sequence of clock pulses it mitigates the problems of "overshoots" and noise mentioned previously. Also, since the slicing level tends to be held by the level correcting signal at the predetermined proportion of the absolute amplitude of the received data pulse signal, there is the further advantage that the problem of co-channel interference is mitigated.

In carrying out the method according to the invention, it is envisaged that the slicing level would be held at 50% of the absolute amplitude of the received data pulse signal in order to afford optimum slicing of the signal, in which event the amplitude correction factor has a value corresponding to twice the difference between the mean amplitude of at least part of the sequence of clock pulses and one of the two subsisting amplitudes of the received data pulse signal.

Also according to the invention there is provided an arrangement for slicing data in the form of a bi-amplitude data pulse signal comprising a sequence of clock pulses followed by a sequence of data pulses, which arrangement is characterized in that it comprises: means for determining a data slicing level which is nominally at the absolute mean amplitude for a received data pulse signal; means responsive to a received data pulse signal for producing a sliced data pulse signal in accordance with said data slicing level; means for determining the actual mean amplitude of at least part of the sequence of clock pulses; means for comparing said actual mean amplitude with one of the two subsisting amplitudes of the received data pulse signal to produce an amplitude correction factor proportional to their difference; means for multiplying said sliced data pulse signal by twice said amplitude correction factor to produce a modified sliced data pulse signal; and means responsive to the amplitude difference between said modified sliced data pulse signal and said received data pulse signal to produce a level correcting signal which makes the data slicing level adaptive, tending to maintain its level at the absolute mean amplitude of the received data pulse signal.

The invention also extends to a data slicing arrangement as set forth above, embodied in a television receiver for a television system of the character referred to. Such a television receiver can be adapted to display alpha-numeric text or other message information concurrently with, or as a selectable alternative to, normal picture information.

DESCRIPTION OF THE DRAWINGS

In order that the invention may be more fully understood, reference will now be made by way of example to the accompanying drawings, of which:

FIG. 1 is a block diagram of a television transmission system of the character referred to;

DESCRIPTION OF THE PREFERRED EMBODIMENT

Figure 1:
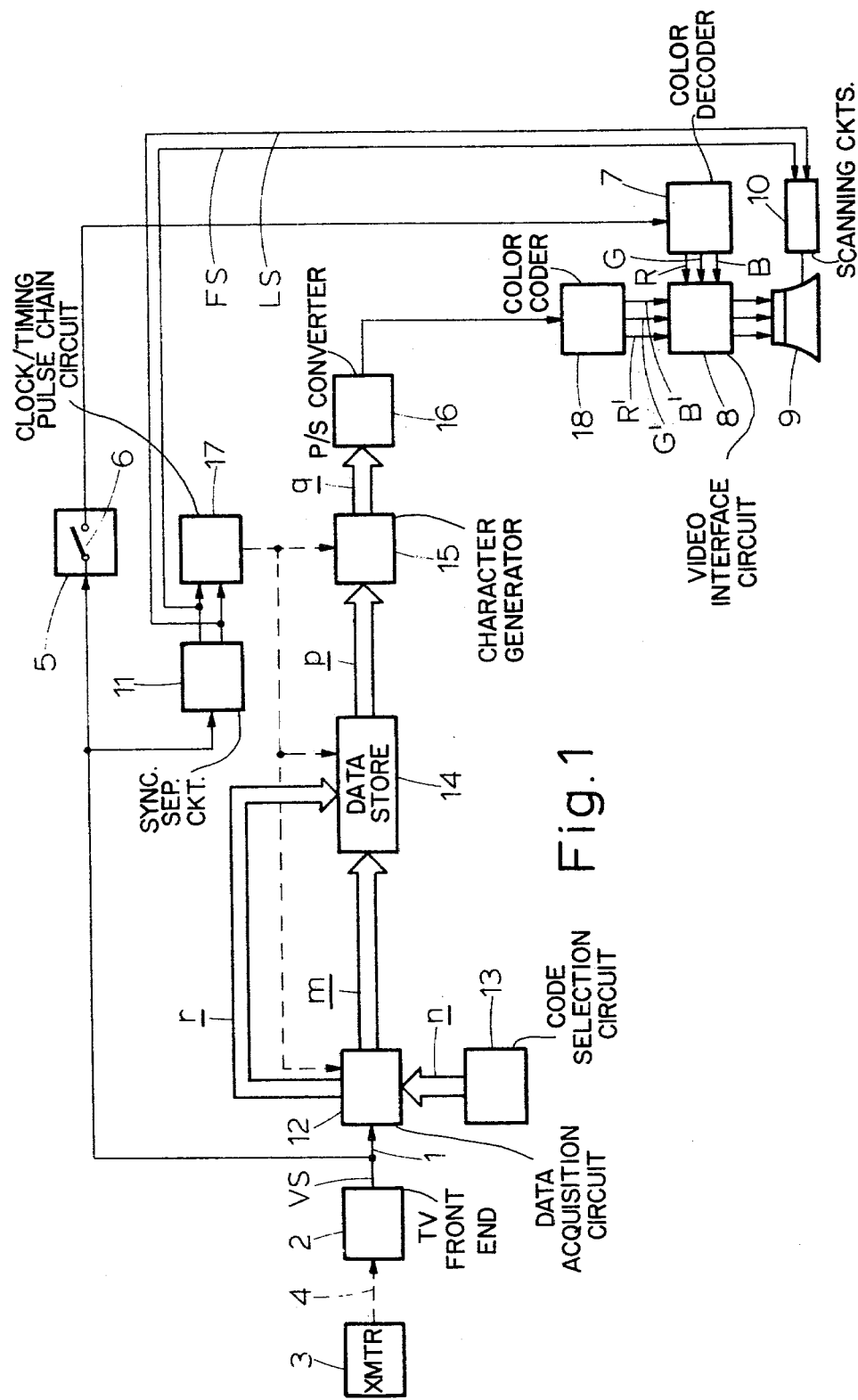

Referring to FIG. 1 of the drawings, there is shown diagrammatically a television transmission system of the character referred to having a television receiver arrangement which embodies the invention and which is arranged for displaying selectively either a television picture which is produced from picture information in a normal broadcast or cable television video signal, or alpha-numeric text or other message information which is produced from coded data pulses which are transmitted in the video signal in vertical or field-blanking intervals thereof. The possibility can also exist for displaying such message information concurrently with a television picture, for instance as sub-titles or captions which are superimposed on the television picture.

An incoming television video signal VS appears at an input lead 1 of the television receiver arrangement via its front end 2 which comprises the usual amplifying, tuning, i.f. and detector circuits. The front end 2 is assumed to be adapted to receive the video signal VS from a television transmitter 3 via a conventional over-air broadcast or cable transmission link 4. The transmitter 3 includes in known manner means for producing television picture information, means for producing alpha-numeric text or other message information, and further means for generating the appropriate composite television video signal containing picture signals representative of the picture information, and coded data pulses representative of the message information, together with the usual synchronising, equalizing and blanking signals which are necessary for the operation of the television receiver arrangement.

For normal picture display in the television receiver arrangement, the received video signal is applied to a selector circuit 5 which includes a selector switch 6. When the switch 6 is closed, the video signal VS is applied to a colour decoder 7 which produces the R, G and B component signals for the picture display, these component signals being applied via a video interface circuit 8 to the red, green and blue guns of a colour television picture tube 9. Scanning circuits 10 for the tube 9 receive the usual line and field synchronising pulses LS and FS from a sync. separator circuit 11 which extracts these synchronising pulses from the incoming video signal VS.

Coded data pulses representing message information in the video signal VS do not affect the picture display because they occur in one or more lines in the field-blanking interval when there is no picture display. Of the lines occurring in the field-blanking interval, most could be used to transmit coded data pulses representing message information. However, in the BBC/IBA Teletext System at present, only lines 17/18 of even fields and lines 330/331 of odd fields of the 625 line broadcast television system are used in the United Kingdom. (See "Broadcast Teletext Specification", September 1976, published jointly by the British Broadcasting Corporation, Independent Broadcasting Authority and British Radio Equipment Manufactureres' Association).

The video signal VS on the input lead 1 is also applied to a data acquisition circuit 12 which includes a data clock pulse generator (not shown) for deriving a data clock pulse train from the coded data pulses representing the message information.

It is assumed that the message information represented by the coded data pulses contained in the video signal VS is divided into different pages of information, and that each page is for display as a whole on the screen of the picture tube 9, with the coded data pulses representing each page of information being repeated periodically in a recurrent cycle with or without updating of the information. It is further assumed that each page of message information is identified by means of a unique page address code which is included in the coded data pulses and defines the page number. The television receiver arrangement includes a code selector circuit 13 which controls the particular coded data pulses that are acquired by the data acquisition circuit 12 at any time. (This control is indicated by a broad-arrow connection n representing the presence of a group of n parallel channels which form an n-bit channel link for carrying n bits of information required for data selection—other groups of parallel channels forming multi-bit channel links in the television receiver arrangement are represented similarly as m, p, q and r numbers of channels and bits).

The acquired coded data pulses are clocked serially into the data acquisition circuit 12 by the data clock pulse train produced in the latter. From the data acquisition circuit 12, the acquired coded data pulses are fed in parallel groups of m bits to a data store 14. It is assumed that an m-bit character byte is required for each character (or other item of information) contained in the message information. If for example, m=8, a character byte would comprise a character code consisting of 7 bits plus a single parity bit. The data store 14 can store a complete page of message information. In a typical Teletext transmission, each page of message information would contain up to 24 rows of characters, with each row containing up to 40 characters. Thus, in order to identify the different characters of a page, it is furthermore assumed that the coded data pulses also include an address code for each character, this address code employing r bits and being fed to the data store 14 over an r-bit channel link to control the storage therein of the character codes.

In view of the restricted transmission time which is available for transmitting the coded data pulses representing message information, for instance, sufficient time to transmit the coded data pulses for only one character row during a television line in the field-blanking interval, character data for a page of message information has to be stored row-by-row in the data store 14 over a relatively large number of television fields. This storing of character data row-by-row in the data store 14 is under the control of the address codes received from the data acquisition circuit 12 over the r-bit channel link.

A character generator 15 of the television receiver arrangement is responsive to the character data stored in the data store 14 to produce character generating data which can be used to derive what is effectively a new picture signal for displaying the characters represented by the stored character data. As mentioned previously, different characters are assumed to be represented by respective m-bit bytes. The bits of the character code in each byte are fed in parallel from the data store 14 to the character generator 15 over a p-bit channel link (p=7). A character format for characters to be displayed can be a co-ordinate matrix composed of discrete elements arranged in rows and columns, this format being derived from a "read-only" memory which serves as the character generator 15 and which provides bits of character generating data in rows and columns, one row at a time. Since the character generating data is required as a modulation of a video signal in order to produce selective bright-up of the screen of the picture tube 9 to achieve character display, the character generating data is produced serially (as 1's and 0's) by using a parallel-to-serial convertor 16 to convert each row of bits of data read out from the character generator 15 (e.g. q=5) into serial form.

In order to effect character display on the screen of the picture tube 9 using standard line and frame scans, the logic of the television receiver arrangement in respect of character display is so organised that for each row of characters to be displayed, all the characters of the row are built up television line-by-television line as a whole, and the rows of characters are built up in succession. It takes a number of television lines to build up one row of characters. In the first television line, character data from the data store 14 to the character generator 15 would cause the latter to produce character generating data in respect of the first row of discrete elements for the first character of the row, then in respect of the first row of discrete elements for the second character, and so on for the successive characters of the row. In the second television line, character generating data in respect of the second row of discrete elements for each character of the row would be produced in turn, and so on for the remaining television lines concerned.

The logic of the television receiver arrangement is organised by means of a clock pulse and timing pulse chain circuit 17 which provides appropriate clock and timing pulses to the data store 14, to the character generator 15, and to the data acquisition circuit 12. The circuit 17 is synchronised in operation with the scanning circuits 10 of the picture tube 9 by the line and field synchronising pulses LS and FS extracted from the incoming video signal VS by the sync. separator circuit 11.

The output from the convertor 16 is applied to a colour coder 18 which produces $R^1$, $G^1$ and $B^1$ component signals for character display, these component signals being also applied to the video interface circuits 8. The colour coder 18 can be controlled (in a manner not shown) by selected items of the character data in the data store 14 to provide a controlled colour character display. Of course, black-and-white picture and character display is also possible, in which event the colour decoder 7 and colour coder 18 would be omitted.

Figure 2A:
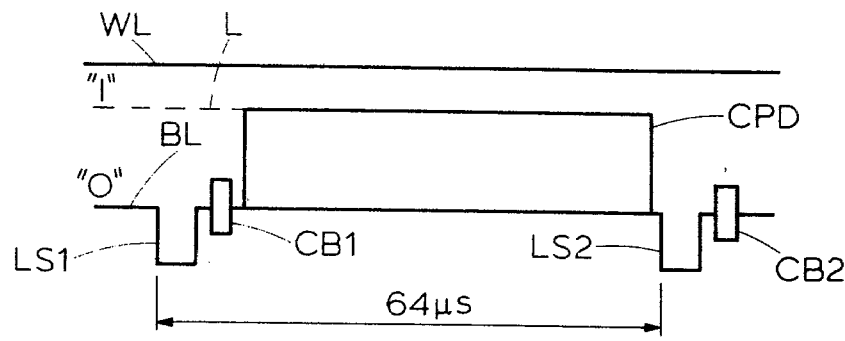
FIGS. 2(a), 2(b) and 2(c) show explanatory diagrams relating to the data pulse coding and transmission of alpha-numeric text or other message information by the system of FIG. 1.

FIG. 2(a) shows a waveform diagram which represents a Teletext television video signal for one television line which occurs in a field-blanking interval and which includes coded pulse data. In this waveform diagram the line synchronising pulse for the television line concerned is represented at LS1, and the line synchronising pulse for the next television line is represented at LS2. The colour burst on the television line concerned and that on the next television line, are represented at CB1 and CB2, respectively. Assuming the television broadcast standards for 625—line systems as employed in the United Kingdom, the period of one television line (i.e. the period between the leading edges of successive line synchronising pulses) is 64 μs., as indicated. Further assuming the standards adopted in the United Kingdom for information transmission by digitally coded pulses in the field-blanking interval of such a 625—line system, then the television line shown would be line number 17 or 18 in an even field and line number 330 or 331 in an odd field. Such a television line is referred to as a television data line and can contain coded data pulses representing 360 binary bits which may be considered as 45 eight-bit bytes. The position of the coded pulse data in the data line is indicated at CPD. The binary bit signalling rate is approximately 7 Mbit/s, and the binary bit signalling levels are defined between a black level BL and a peak white level WL. The binary '0' level is the black level BL and the binary '1' level is the level L.

Figure 2B:
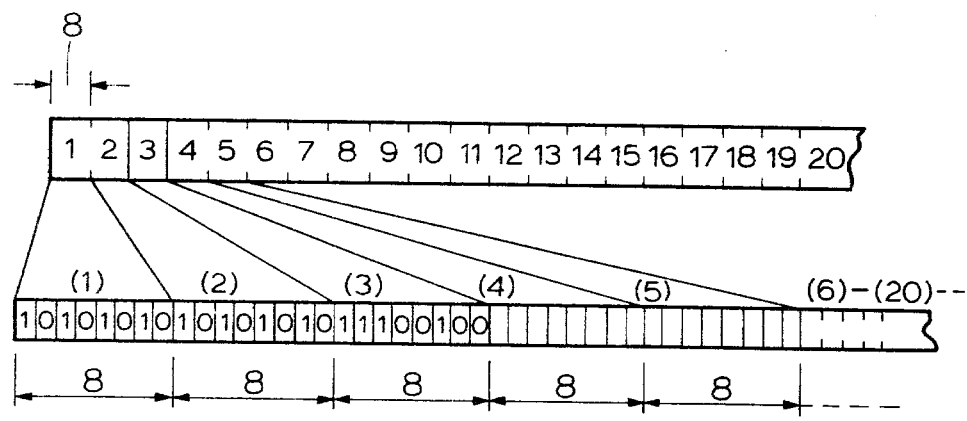

FIG. 2(b) shows a possible format for coded pulse data in a television data line. As mentioned above, the binary bits representing the coded pulse data are divided up into eight-bit bytes 1, 2, ... 20 ... In accordance with the particular character of television transmission system to which the present invention obtains, the first two bytes 1 and 2 comprise a sequence of clock run-in pulses which in the present example consist of a sequence of alternating bits 10101010/10101010. The third byte 3 comprises a framing or start code, e.g. 11100100, which a television receiver arrangement has to identify before it will respond to accept message information which is contained in the remaining eight-bit bytes 4, 5 ... 20 ... This identification of the framing code is effected in known manner in the television receiver arrangement of FIG. 1 by the data acquisition circuit 12. However, this part of the data acquisition circuit operation is not relevant to the present invention, so that it is not thought necessary to include any details of such operation in the present specification.

Figure 2C:
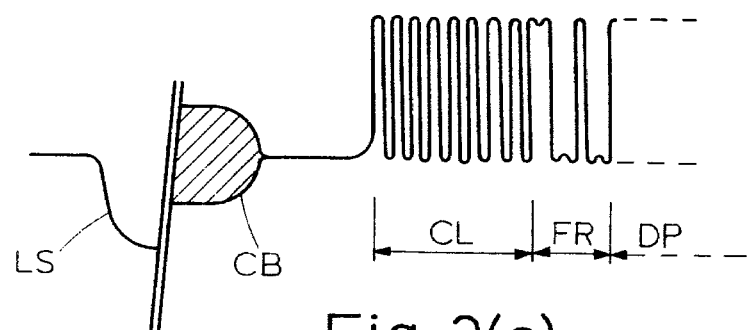

FIG. 2(c) shows in idealised form the first part of a video signal waveform for a television data line showing the sequence of clock run-in pulses CL and the sequence of pulses which comprise the framing code FR. The first few coded data pulses which represent alpha-numeric characters or other message information are shown at DP. The line synchronising pulse is represented at LS and the colour burst at CB.

Figure 3:
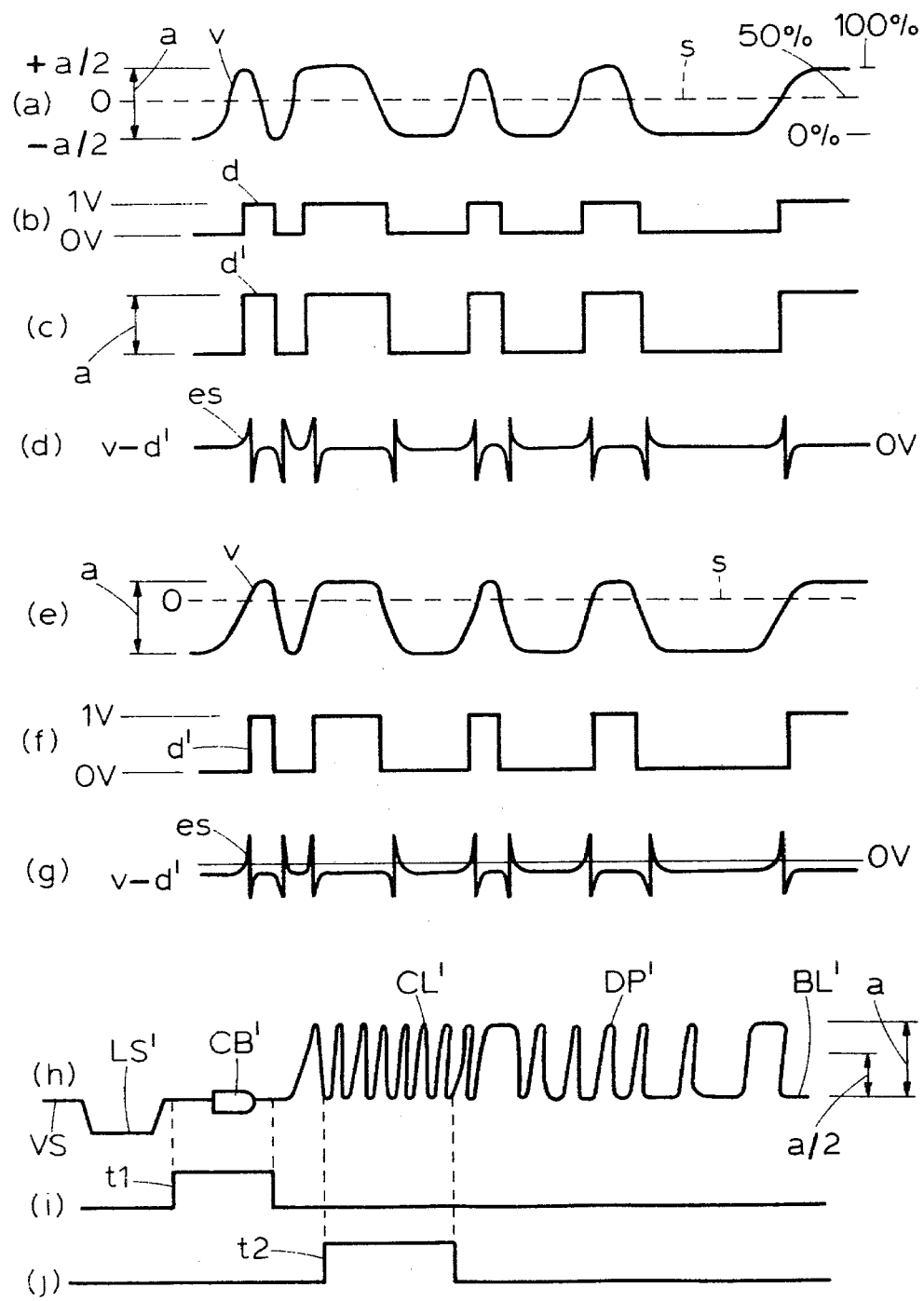
FIG. 3 shows explanatory waveform diagrams relating to the principle of operation of the invention.

Referring now to the waveform diagrams shown in FIG. 3 which relate to the principle of operation of the invention, waveform diagram (a) shows a typical video waveform v of a data pulse signal. This waveform v can be considered as having two data levels; that is, a 0% level for a binary '0' and a 100% level for a binary '1' level. By comparing this waveform v with that shown in FIG. 2(a), it can be seen that the 0% level corresponds to the black level BL, while the 100% level corresponds to the level L. In general, the video waveform v shown in the waveform diagram (a) of FIG. 3 can be considered as having an amplitude of a volts (+a/2, 0, −a/2) for which the correct slicing level s (for an undistorted signal) would be at the 0 volt or 50% level. In other words, the data pulse signal is assumed to be composed of positive and negative pulses; that is, positive for a binary '1' and negative for a binary '0'. This is equivalent to assuming that the data pulse signal has a pulse to denote a binary '1', and has no pulse to denote a binary '0'. Thus, the correct slicing level s is the 50% level as shown.

Waveform diagram (b) in FIG. 3 shows a sliced data pulse signal d which is assumed to have been derived from the waveform v using the 50% slicing level s, and limited to, say, 1 volt amplitude as shown. If the amplitude of the signal d is multiplied by an amplitude correction factor a, the waveform d' shown in waveform diagram (c) is produced. Waveform diagram (d) in FIG. 3 shows a difference signal es which is formed by subtracting waveform d' from waveform v (i.e. v−d'). This difference signal es has a mean value of zero and can be integrated to form the slicing level s which is at the 50% level. If the slicing level s is not at the 50% level, because the d.c. level of the video waveform v is low, as shown for example in waveform diagram (e), the data pulse signal is incorrectly sliced and the waveform d' has reduced width pulses, as shown in waveform diagram (f), as compared with waveform diagram (c). The difference signal es then has a mean value as shown waveform diagram (g), this mean value of the difference signal es being in the sense tending to bring the slicing level s back to the 50% level. Thus, in the example shown in which the slicing level s is, in effect, too high, the mean value of the difference signal es acts to reduce the magnitude of the slicing level s. Similarly, if the d.c. level of the video waveform v is correct, but the slicing level s is not at the 50% level, then in this instance the mean value of the difference signal es is in a sense tending to bring the slicing level s back to the 50% level. Also, a combination of an error in both the d.c. level and the slicing level will cause the difference signal es to have a mean value which tends to correct the error. The waveform diagrams in FIG. 3 illustrate the principle of providing an adaptive data slicing level which is held at 50% of the data pulse amplitude regardless of the actual d.c. level of the data pulse signal. This slicing level, as produced by integrating the difference signal es, can thus follow low-frequency variations in the data pulse signal such as are produced by co-channel interference. By using a suitably chosen time constant for integrating the difference signal es, the effects of "overshoots" and noise can be significantly reduced.

Figure 4:
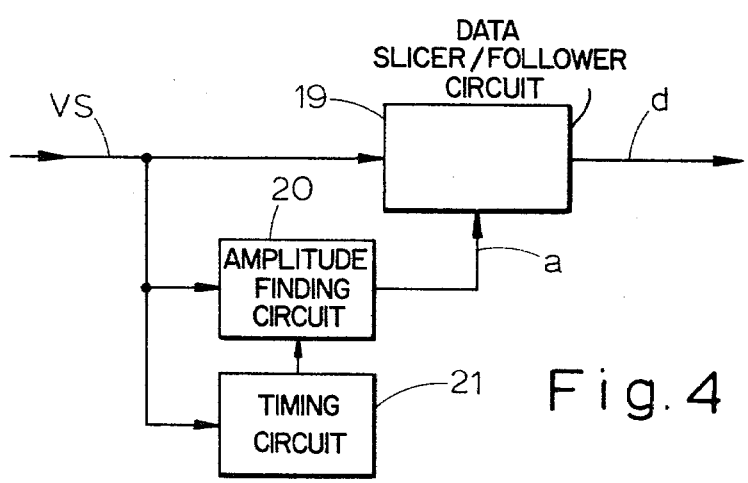
FIG. 4 is a block diagram of a data slicing arrangement according to the invention.

In order to carry out adaptive data slicing as described above with reference to the waveform diagrams of FIG. 3, a data slicing arrangement as shown in FIG. 4 can be used. This data slicing arrangement comprises a data slicer and follower circuit 19, an amplitude finding circuit 20 and a timing circuit 21. A television video signal vs is applied to each of these circuits 19, 20 and 21. This video signal vs for one television line is represented by the waveform diagram (h) in FIG. 3 and comprises a line synchronising pulse LS', a colour burst CB', a sequence of clock pulses CL' and a sequence of data pulses DP'. The pulses have the amplitude a, as before. The amplitude finding circuit 20 operates, in a manner to be described, to produce an amplitude correction factor a which, in effect, is a signal having an amplitude corresponding to the absolute amplitude a of the video signal vs. The timing circuit 21 operates, in a manner to be described, to provide a first period during which the black level BL' of the video signal vs can be determined by and stored in the amplitude finding circuit 20, and a second period during which the mean amplitude a/2 of at least part of the sequence of clock pulses CL' of the video signal vs can be determined by and stored in the amplitude finding circuit 20. These first and second periods are defined by two timing pulses t1 and t2 as shown at (i) and (j), respectively, in FIG. 3. The data slicer and follower circuit 19 operates, as will be described next with reference to FIG. 5, to produce the sliced data pulse signal d from the video signal vs using an adaptive data slicing level which is adjusted in accordance with the amplitude correction factor (signal) a.

Figure 5:
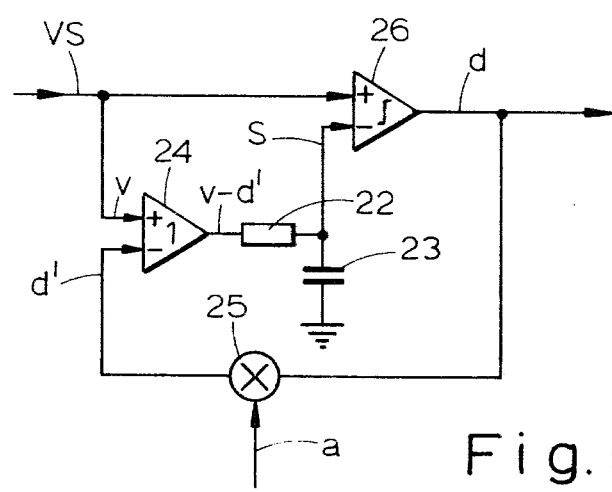
FIGS. 5 to 7 show respective circuit elements for the arrangement of FIG. 4.

The data slicer and follower circuit 19 can be of the form shown in FIG. 5. This circuit comprises an integrator which is formed by a resistor 22 and a capacitor 23 and which determines the slicing level s in accordance with the difference signal v−d' which is fed to it from a difference amplifier 24. This difference signal can be considered to be a level correcting signal in that it continually and adaptively alters the slicing level s. The difference signal v−d' is produced by the difference amplifier 24 in response to the video signal vs and the modified data pulse signal d' which are applied to its inputs + and −, respectively. The signal d' is produced by a multiplier 25 as the product of the amplitude correction signal a and the sliced data pulse signal d which are applied to it. The sliced data pulse signal d is produced at the output of a limiter amplifier 26 which is fed with the video signal vs and the slicing level s at its inputs + and −, respectively. The amplitude of the signal d tends to be maintained constant.

Figure 6:
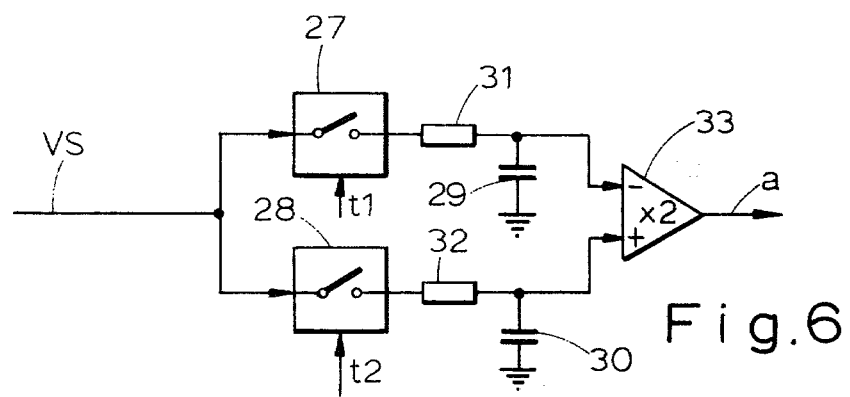

FIG. 6 shows an amplitude finding circuit 20 which comprises two switches 27 and 28, two storage capacitors 29 and 30 and associated resistors 31 and 32 and a difference amplifier 33. The video signal vs is fed to the two switches 27 and 28. The switch 27 is closed by and for the duration of the timing pulse t1 to cause the black level amplitude to be stored on the capacitor 29 and the switch 28 is closed by and for the duration of the timing pulse t2 to cause the mean amplitude of the sequence of clock pulses to be stored on the capacitor 30. By comparing these two stored amplitudes by means of the difference amplifier 33 and multiplying the result (a/2) by 2 by giving the amplifier 33 a gain of ×2, the absolute amplitude a of the sequence of clock pulses is obtained. a is the amplitude correction factor (signal), and is held for the rest of the television line.

Figure 7:
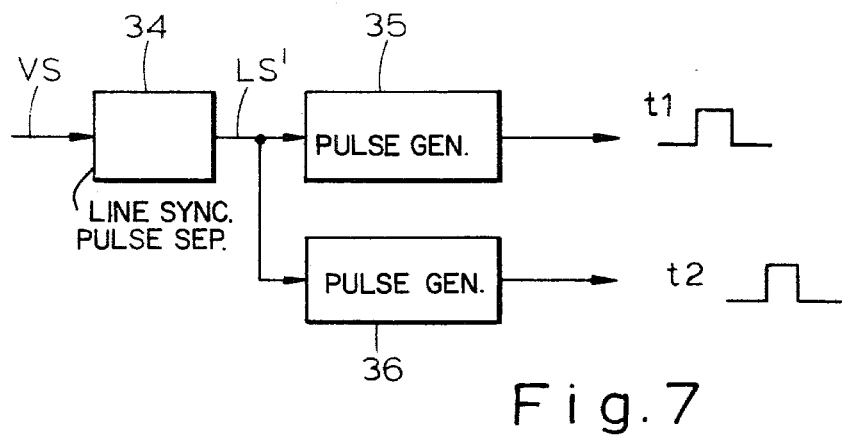

FIG. 7 shows a timing circuit 21 which comprises a line synchronising pulse separator 34 and two pulse generators 35 and 36. The sync. separator 34 detects the line sync. pulse LS' in the video signal vs to trigger the pulse generators 35 and 36 which are responsive to produce the timing pulses t1 and t2, respectively. The pulse generators 35 and 36 include respective trigger delays, so that the timing pulses t1 and t2 occur, respectively, during a portion of the black level period between the end of the line synchronising pulse LS' and the beginning of the sequence of clock pulses CL', and during a portion of the sequence of clock pulses. The tolerances in the timing of the coded pulse data along the television line have to be taken into account when determining the trigger delays for the pulse generators 35 and 36.

I claim:

1. A method of slicing data in the form of a bi-amplitude data pulse signal comprising a sequence of clock pulses followed by a sequence of data pulses, which method comprises the steps of:

determining a data slicing level which is nominally at the absolute mean amplitude for a received data pulse signal;

producing, in response to a received data pulse signal, a sliced data pulse signal in accordance with said data slicing level;

determining the actual mean amplitude of at least part of a sequence of clock pulses in said received data pulse signal;

comparing said actual mean amplitude with one of the two subsisting amplitudes of the received data pulse signal to produce an amplitude correction factor proportional to the difference;

multiplying said sliced data pulse signal by said amplitude correction factor to produce a modified sliced data pulse signal; and comparing, continually during the sequence of data pulses, the amplitude of said received data pulse signal with that of said modified sliced data pulse signal for forming a level correction signal for adapting said data slicing level to the actual absolute mean amplitude of said received data pulse signal.

2. A method as claimed in claim 1, characterized in that the slicing level is held at 50% of the absolute amplitude of the received data pulse signal by giving the amplitude correction factor a value corresponding to twice the difference between the mean amplitude of at least part of the sequence of clock pulses and one of the two subsisting amplitudes of the received data pulse signal.

3. An arrangement for slicing data in the form of a bi-amplitude data pulse signal comprising a sequence of clock pulses followed by a sequence of data pulses, which arrangement is characterized in that it comprises: means for determining a data slicing level which is nominally at the absolute mean amplitude for a received data pulse signal; means responsive to a received data pulse signal for producing a sliced data pulse signal in accordance with said data slicing level; means for determining the actual mean amplitude of at least part of the sequence of clock pulses; means for comparing said actual mean amplitude with one of the two subsisting amplitudes of the received data pulse signal to produce an amplitude correction factor proportional to their difference; means for multiplying said sliced data pulse signal by twice said amplitude correction factor to produce a modified sliced data pulse signal; and means responsive to the amplitude difference between said modified sliced data pulse signal and said received data pulse signal for producing a level correcting signal which makes the data slicing level adaptive to tend to maintain its level at the absolute mean amplitude of the received data pulse signal.

4. An arrangement according to claim 3, characterized in that it comprises: an amplitude finding circuit which is responsive to the received data pulse signal to produce said amplitude correction factor; a timing circuit for providing a first period during which said one subsisting amplitude of the received data pulse signal can be determined by and stored in the amplitude finding circuit and a second period during which the mean amplitude of at least part of the sequence of clock pulses can be determined by and stored in the amplitude finding circuit; and a data slicer and follower circuit which is responsive to said received data pulse signal and said amplitude correction factor to produce the adaptive data slicing level and the sliced data pulse signal in accordance with such level.

5. An arrangement as claimed in claim 4, adapted for operation when said received data pulse signal occurs on a television line and is preceded by the line synchronising pulse for the television line characterized in that: said timing circuit comprises a line synchronising pulse separator and two pulse generators coupled to said pulse separator which pulse generators produce, in response to a line synchronizing pulse, respectively, a first timing pulse for a portion of the black level period between the end of the line synchronising pulse and the beginning of the sequence of clock pulses and a second timing pulse for a portion of the sequence of clock pulses; and said amplitude finding circuit comprises a first switch and a first storage capacitor coupled thereto, said first switch being closed by said first timing pulse to cause the black level amplitude to be stored on said first storage capacitor, a second switch and a second storage capacitor coupled thereto, said second switch being closed by said second timing pulse to cause the mean amplitude of the sequence of clock pulses to be stored on said second storage capacitor; and a difference amplifier which produces a difference signal corresponding to the difference between the two stored amplitudes, said difference signal constituting said amplitude correction factor.

6. An arrangement as claimed in claim 5, wherein said difference amplifier has a gain of two.

7. An arrangement as claimed in claim 4, claim 5 or claim 6, characterized in that said data slicer and follower circuit comprises: an integrator for determining said slicing level; a first difference amplifier which is fed with said received data pulse signal and said slicing level to produce said sliced data pulse signal; a multiplier which is fed with said sliced data pulse signal and said error correction factor to produce said modified sliced data pulse signal; and a second difference amplifier which is fed with said modified sliced data pulse signal and said received data pulse signal to produce said level correcting signal, which latter signal is applied to said integrator.

8. An arrangement as claimed in claim 7, in combination with a television receiver which is adapted to display alpha-numeric text or other message information concurrently with, or as a selectable alternative to, normal picture information.

* * * * *